Dec. 11, 1951 W. G. PFANN 2,577,803

MANUFACTURE OF SEMICONDUCTOR TRANSLATORS

Filed Dec. 29, 1948

INVENTOR
W. G. PFANN
BY
[signature]
ATTORNEY

Patented Dec. 11, 1951 2,577,803

UNITED STATES PATENT OFFICE 2,577,803

MANUFACTURE OF SEMICONDUCTOR TRANSLATORS

William G. Pfann, Chatham, N. J., assignor to Bell Telephone Laboratories, Incorporated, New York, N. Y., a corporation of New York Application December 29, 1948, Serial No. 67,797

12 Claims. (Cl. 175—366)

This invention relates to translating devices and more particularly to semiconductor translators and to methods of making them.

As pointed out in the application of W. H. Brattain Serial No. 67,781, filed December 29, 1948, semiconductor translators having point contact connections may be improved by a "forming" treatment of certain of such connections. The treatment is peculiar to devices having more than two connections, e. g. a semiconductor triode amplifier such as disclosed in the application of J. Bardeen and W. H. Brattain, Serial No. 33,466, filed June 17, 1948, now Patent No. 2,524,035, as contrasted with forming treatments of semiconductor diodes such as point contact crystal rectifiers.

In amplifiers and like devices of this type, the input may be connected between a base connection and a connection called the emitter and the output between the same base connection and a connection denoted as the collector.

An object of this invention is to improve semiconductor translators of the type indicated whereby greater power gains, for example, may be attained.

One feature of this invention resides in correlating surface treatments, contact material and spacing, and forming procedure so that an improved power gain is attained.

Another feature involves the control of forming voltages whereby substantially optimum improvement in power gain is attained.

An additional feature lies in the use of a controlled emitter bias for determining the forming action of a voltage on the collector.

A further feature involving surface treatment of the semiconductor resides in proper washing and drying following a treatment of the surface with a suitable etchant.

Other and further objects and features of this invention will appear more fully and clearly from the following description of illustrative embodiments thereof taken in connection with the appended drawings in which.

Semiconductors which have been found suitable for use in devices of this invention include germanium and like materials containing minute quantities of significant impurities which comprise one way of determining the conductivity type (either N- or P-type) of the semiconductive material. The conductivity type may also be determined by energy relations within the semiconductor. For a more detailed explanation, reference is made to the application of J. Bardeen and W. H. Brattain Serial No. 33,466, filed June 17, 1948.

The terms N-type and P-type are applied to semiconductive materials which tend to pass current easily when the material is respectively negative or positive with respect to a conductive connection thereto and with difficulty when the reverse is true, and which also have consistent Hall and thermoelectric effects.

The expression "significant impurities" is here used to denote those impurities which affect the electrical characteristics of the material such as its resistivity, photosensitivity, rectification and the like, as distinguished from other impurities which have no apparent effect on these characteristics. The term "impurity" is intended to include intentionally added constituents as well as any which may be included in the basic material as found in nature or as commercially available.

Figure 1:
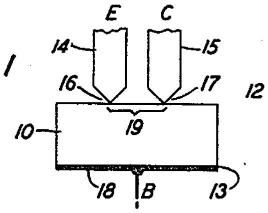
Fig. 1 is a schematic representation of a translating device of the general type to which this invention pertains.

In Fig. 1 are shown the essential elements of an illustrative form of translating device on which this invention may be practiced, the housing, support means and the like having been omitted in the interest of clarity. The semiconductive block 10 may comprise N-type germanium material to which are connected three electrodes 14, 15 and 18 which are designated emitter, collector and base, respectively, and which are denoted as E, C and B, respectively. The base electrode 18 is connected to the back surface 13 of the germanium block as by electroplating or soldering. The electrodes 14 and 15 are of the point contact or restricted area type and may be maintained in position on the front surface 12 of block 10 by the pressures of contact springs of which 14 and 15 are the ends. The diameters of the junctions 16 and 17 between the electrodes 14 and 15, respectively, and the surface 12 may be of the order of 0.001 inch or less and the distance 19 between the junctions 16 and 17 is usually from about 0.001 inch to 0.006 inch although in some cases the distance 19 may be less than 0.001 inch and as large as 0.020 inch or more. The electrodes 14 and 15 may be of copper or Phosphor bronze, although silver, tungsten, molybdenum, aluminum, platinum and other materials have been used.

The N-type germanium material may be prepared in the manner described in the application of J. H. Scaff and H. C. Theuerer, Serial No. 638,351, filed December 29, 1945, or, as described in "Crystal Rectifiers" by Torrey and Whitmer, vol. 15, Radiation Laboratories Series (MIT). Germanium containing small percentages of antimony up to .0005 per cent has been used successfully in some embodiments of this device.

The properties and characteristics of the finished translating device are to a considerable extent dependent upon the manner of preparation of the front surface 12 of the semi-conductor. This preparation includes the steps of surfacing, etching, washing and drying, although it is possible to employ the forming techniques of this invention successfully on surfaces which have been subjected to other methods of preparation, as, for example, those surfaces existing along cleavage planes which are created by crushing the germanium ingot.

One useful surfacing procedure consists of grinding the semiconductor on a glass lap by an abrasive such as 600 grit aluminum oxide in water. The result may be described, as a matte finish. An alternative procedure which produces a smooth, polished surface comprises polishing germanium material after the above steps on rotating cloth laps containing as an abrasive an aqueous suspension of 600 or 900 grit aluminum oxide. The surfaces resulting from the above-described processes will be referred to as ground and as polished, respectively.

In order to improve the properties and characteristics of the finished translating device, and also to increase its response to the step of electrical conditioning to be described, the ground or polished surface may be etched. A number of etching procedures may be used to enhance the sensitivity of the semiconductive surface. By sensitivity is meant the degree of response of the translating device to the electric conditioning step to be described.

One successful etchant, which will hereinafter be referred to as the hydrogen peroxide etchant, contains 40 parts by volume of water, 10 parts of 48 per cent hydrofluoric acid and 10 parts of 30 per cent hydrogen peroxide. The germanium material is etched by immersion for a period of about one minute, although the etching time is not particularly critical in the range from fifteen seconds to ten minutes. This etchant is described in the application of H. C. Theuerer, Serial No. 135,817, filed December 29, 1949, now Patent No. 2,542,727. Immediately upon removal from the etchant, the semiconductor is washed in a brisk flow of cold tap or distilled water for a period from several seconds to two minutes. The semiconductor is then immediately dried in a strong air blast. An alternative drying procedure is to rinse the semiconductor, after washing, in methyl alcohol and then in acetone and then to dry it in still air or an air blast. It is important that the step of washing in water be carried out as described since it results in a high reverse impedance and a high maximum reverse voltage at the rectifying junctions such as 16 and 17 of Fig. 1. These characteristics are particularly useful at electrode 17 since they favor improved electrical conditioning.

The proportions of the components of this etchant are not particularly critical and may be varied over a considerable range.

The roughness of the unetched surface is a factor in determining the sensitivity which will result from etching, a smooth surface becoming more sensitive than a rough one. Where the etchant itself produces a smoothing action, the improvement in sensitivity may be due in part to the smoothing and in part to the chemical effect of the etchant. However, since contact points may slip on a very smooth surface it may at times be desirable to sacrifice some degree of sensitivity due to smoothness in order to take advantage of the keying effect of a rough surface on the point electrodes. The combination of a ground surface and the hydrogen peroxide etchant has been found to provide a desirable combination of sensitivity and stability.

Although the resulting sensitivity appears to be less than for the hydrogen peroxide etchant, the following etchant has been used successfully: concentrated nitric acid 10 cubic centimeters, 48 per cent hydrofluoric acid 5 cubic centimeters, copper nitrate 0.2 gram and water 10 cubic centimeters.

The properties and characteristics of a finished translating device may be further enhanced by electrical forming or conditioning in addition to and in cooperation with the previously described steps of preparation.

Figure 2:
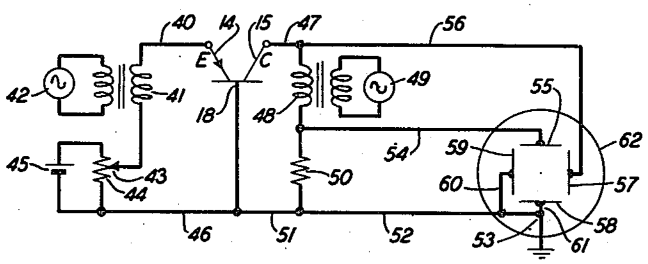
Fig. 2 illustrates an electrical circuit for the observation of current voltage characteristics of the translating device and also for the electrical conditioning thereof.

The circuit shown in Fig. 2 may be used to examine the amplifying properties of the translating device and to perform the forming steps. In this circuit, the emitter 14 is connected by lead 40 to one terminal of a low impedance secondary winding 41 of a transformer across the primary winding of which is impressed an alternating voltage of a frequency of about 1000 cycles per second, from the signal source 42. The other terminal of winding 41 is connected to the movable tap 43 of potentiometer 44. A source of steady voltage 45 is connected across potentiometer 44 in such a way that tap 43 will be positive with respect to base electrode 18. The end of potentiometer 44 to which is connected the negative terminal of voltage source 45 is connected by lead 46 to base connection 18 of the translating device. The voltage 45 may be from 2 to 12 volts and the resistance of the winding of the potentiometer 44 may be 500 ohms or less. The amplitude of the signal appearing across winding 41 may be about 0.1 volt.

The collector 15 is connected by lead 47 to one end of a low impedance secondary winding 48 of an isolating transformer across the primary winding of which is connected an adjustable source of 60 cycles per second alternating voltage indicated at 49. Voltages of from 0 to 135 volts should be available across the winding 48. The other end of the winding 48 is connected through a resistor 50 and lead 51 to the base electrode 18. The resistor 50 may be of the order of 5000 ohms or larger.

To observe the relationship between the current through the collector junction 17 and the potential difference between the collector 15 and the base 18, the following connections are made to a cathode ray oscilloscope 62. A point common to the collector 15 and the winding 48 is connected by a lead 56 to a horizontal plate 57 of the oscilloscope 62. A point common to the winding 48 and resistor 50 is connected by lead 54 to the vertical plate 55 of the oscilloscope. A point common to the base electrode 18 is connected by lead 52 to the ground terminal 53 of the oscilloscope and the remaining horizontal and vertical plates 59 and 58 respectively are connected by the leads 60 and 61 to the ground connection 53 of the oscilloscope.

Figure 4:
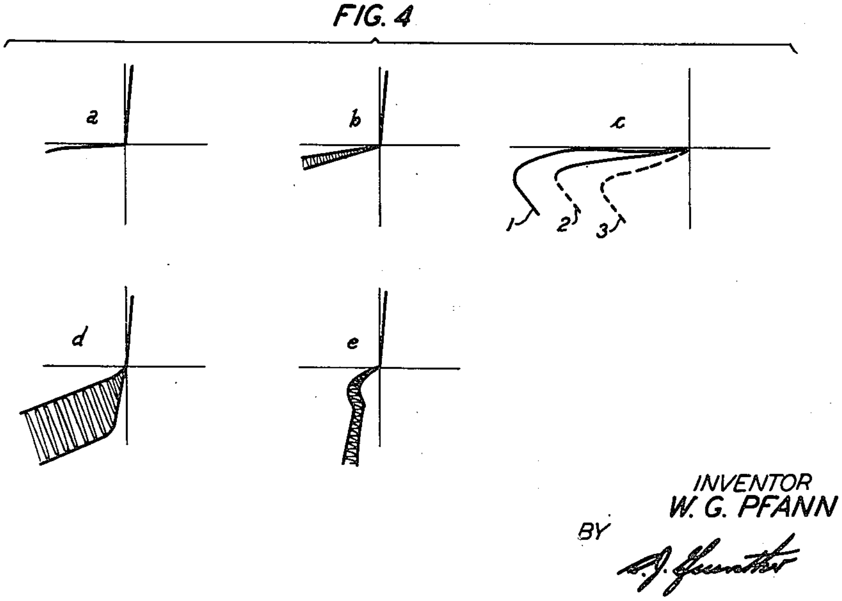
Fig. 4 shows current voltage patterns observed on a properly connected oscilloscope during the electrical conditioning of the translating device.

If the voltage across winding 48 is increased to a convenient value, say 30 volts, a pattern will be displayed on the oscilloscope in which the horizontal deflection at any point is proportional to the voltage between the collector and ground and the vertical deflection is proportional to the current through the collector. Representative patterns for a translating device in which the collector and the emitter have been brought into contact with a germanium slab which has been etched as described above, but has not yet been formed, are indicated in Fig. 4 at *a* and *b*, repectively. In Fig. 4*a* the emitter is open-circuited and in Fig. 4*b* the emitter circuit is closed with a bias of about one volt. Thus Fig. 4*a* shows essentially the voltage-current pattern of the collector junction 17 which is a rectifying junction. The effect of the emitter, which is shown in Fig. 4*b*, may be regarded as a modification of the reverse, or high impedance, portion of the voltage-current pattern of the collector. Modulation of the collector pattern shown in Fig. 4*b* is caused by the 0.1-volt signal impressed on the emitter. For some surfaces, the modulation of the voltage across the collector represents a voltage amplification and for some of the more sensitive surfaces this may result in amplification of the input power by about 10 to 13 decibels. However, the translating device may exhibit relatively small power amplification, or a power loss, prior to forming.

Figure 3:
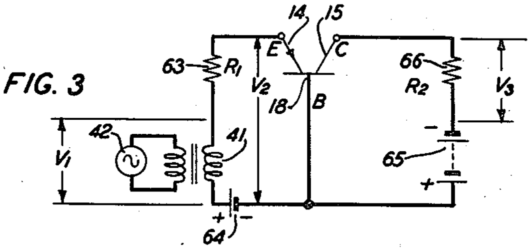
Fig. 3 is a diagram of an electrical circuit for measurement of the amplification produced by the translating device.

The power amplification may be measured in a circuit as shown in Fig. 3 in which the electrode designations of the translating device are as in the previous figures. The input circuit contains in series and connected between 14 and 18 a resistance 63 (R1), a winding 41 as in Fig. 2 connected through a transformer to the signal source 42, a bias source 64 which may be a battery or a potentiometer, and the negative side of which is connected to the base electrode 18. The resistor R1 may be made adjustable and is generally on the order of 100 to 500 ohms. The output circuit contains in series and connected between 15 and 18 a load resistance 66 (R2) of about 10,000 ohms and a source of voltage 65 with its positive side connected to the base electrode 18. This source 65 may be a battery or potentiometer and may have a value of about 1 to 50 volts.

The symbols $V_1$, $V_2$ and $V_3$ in Fig. 3 represent the alternating voltages across 41, between electrodes 14 and 18, and across $R_2$, respectively.

The power gain may be defined as:

$$\text{gain} = \frac{\text{Output power delivered to } R2}{\text{Input power to translator}}$$

or $$g = \frac{V_3^2 R_1}{V_2 (V_1 - V_2) R_2}$$

If the voltage across 48 in Fig. 2 is increased sufficiently, the voltage-current pattern will go "over the peak," that is, the current at the voltage maximum in the reverse direction of the collector junction 17 will be exceeded. When the emitter is open-circuited the pattern is as at 1 in Fig. 4*c*. If the emitter circuit is closed and the emitter current is increased by adjusting 43 the curve will move toward position 2 and then to position 3. Modulation due to the signal at 41 will be present also but is not shown in Fig. 4*c*. At some stage in this process the translating device will "form" and when the voltage 48 is reduced again to about 30 volts a pattern like that shown in 4*d* will appear at an optimum emitter bias usually between 0 and +1 volt. The breadth of the modulated region in 4*d* is a rough index of power amplification.

Although it is generally necessary to "go over the peak" to form a translating device having Phosphor bronze points on a ground surface etched in the hydrogen peroxide etchant, some of the more sensitive surfaces can be formed at collector voltage swings below the peak value by increasing the emitter bias voltage.

If the surface is very sensitive or if the points are too close together or if too large forming voltages are used, "over-forming" may result, as shown in Fig. 4*e*. The voltage current pattern as here shown has unstable regions due to negative resistance.

Amplifying translators treated in accordance with the previously described technique have been made with power gains up to 17 decibels at a collector bias of −4 volts, and 19 decibels at a collector bias of −5 volts.

The current multiplication designated by $\alpha$ is defined as:

$$\alpha = \frac{\delta I_c}{\delta I_E} E_c \text{ const.}$$

where $I_c$=collector current
$I_E$=emitter current
$E_c$=collector bias voltage In devices treated in accordance with this invention values of $\alpha > 1$ have been obtained at collector voltages as low as −1 volt and at higher values of collector voltage $\alpha$'s as large as about 10 have been obtained.

For satisfactory forming the resistance in the collector circuit should be relatively high, for example, resistance 50 should be about 5000 ohms or greater. The resistance in the emitter circuit is generally held to a relatively low value preferably not over about 200 ohms, since it appears undesirable to limit the emitter current during forming. On the other hand, the use of an excessively large emitter bias voltage may also result in poor forming.

If the contact points are too close, over-forming may result, if too far apart little or no improvement is achieved.

The optimum spacing is on the order of thousandths of an inch and as indicated previously depends on the surface roughness, the etchant used and the composition of the contact points.

One possible explanation of the action of the forming which imparts the property of current multiplication to translating devices of this type involves the establishment of transformed regions in the semiconductor beneath the collector point. Such regions may be produced by the heating and the field of the forming current, the important part of the action occurring when the collector is at a negative potential with respect to the base. Such a transformed region may be produced adjacent the collector by passing current between the collector and the base, with the emitter out of circuit. The transformed region for such forming may be relatively small and is probably symmetrical about the collector point. However, for devices of the type herein under consideration, such as amplifiers, it appears desirable to have the transformed region enlarged so as to extend toward the emitter. This is done by having the emitter in the circuit so that current is drawn from the emitter through the collector during forming either by an aiding potential in the base to emitter circuit biased in the forward direction or by virtue of the potential in the base-collector circuit alone, such a potential in effect being applied through the common base electrode across the parallel base to collector and emitter to collector body resistances. A transformed region so produced will be relatively large and may be symmetric in shape or may be asymmetric, extending preferentially toward the emitter. In either case, the edge of the transformed region will approach closer to the emitter than when forming is done without the use of the emitter. By bringing the edge of the transformed region closer to the emitter, the effect of the emitter on the collector current is enhanced by more effective collection of the charges coming from the emitter and the high frequency operation of such a device is extended by reduction of the transit time for current carriers from the emitter to the transformed region.

Although this invention has been described with respect to particular illustrative embodiments thereof, it will be understood that various changes may be made therein without departing from the spirit and scope of the invention.

What is claimed is:

1. The method of improving the amplification of a semiconductive translator having spaced point contacts that comprises applying an alternating voltage between the body of the translator and a first point contact through a resistor of sufficient resistance to hold the forward current through said first contact to a low value while another contact is connected to the body, the applied voltage being of sufficient amplitude to produce a negative reverse resistance characteristic through said first contact.

2. The method of conditioning a semiconductor translator having two spaced rectifying contacts and a base contact on a body of N-type germanium material, that comprises etching a portion of the body, applying spaced rectifying contacts to the etched portion, and passing a limited alternating current through the body between one rectifying contact and the base contact in the direction of difficult flow of current while the other rectifying contact is connected to the base contact.

3. The method of improving the amplification of a semiconductive amplifier having spaced point contacts on a semiconductive body, that comprises etching the part of the body to which point contact is to be made with a hydrogen peroxide etchant, washing the etched part in water and drying it, applying the point contacts to the etched part, and applying an alternating voltage to one point contact, the maximum of said voltage being sufficient to carry the reverse voltage-current characteristic of this contact into the negative resistance region, while both point contacts are connected to a common third connection on the semiconductive body.

4. The method of forming the collector connection of a semiconductor triode that comprises applying a relatively high pulsating voltage between the collector connection and the semiconductor body and controlling the effect of said voltage by varying a relatively low voltage applied between the emitter connection and the semiconductor body.

5. The method of preparing a semiconductive body of N-type germanium material for use in a semiconductor translator which comprises etching a surface of the body in an etchant consisting of 30 per cent hydrogen peroxide, 48 per cent hydrofluoric acid and water, immediately washing the etched surface in water, immediately drying said surface, applying spaced point contacts to the etched surface, and passing a pulsating current through one point contact while both point contacts are connected to a third, common, ohmic contact to the body.

6. The method of improving the amplification of a semiconductor translating device that comprises etching a surface of a body of N-type germanium material, applying spaced point contacts to the etched surface, one of said contacts containing copper, and applying a pulsating voltage having a relatively high reverse peak to the copper containing contact while both contacts are connected to an ohmic connection on the body.

7. The method of improving the amplification of a semiconductor translating device that comprises etching a surface of a body of N-type germanium material, applying spaced point contacts to the etched surface, one of said contacts being of Phosphor bronze, and applying a pulsating voltage having a relatively high reverse peak to the Phosphor bronze contact while both point contacts are connected to a common ohmic connection on the body.

8. The method of controlling the forming of the collector connection of a semiconductor triode having emitter, collector and base connections, that comprises varying the forward potential between the emitter and the base while applying an alternating potential between the collector and the base.

9. The method of improving the amplification of a semiconductor amplifier having an emitter, a collector and a base connection on a body of N-type germanium material, that comprises forming the collector by applying thereto an alternating voltage from a source on the order of 100 volts through a resistance on the order of 5,000 ohms while the emitter connection is subjected to a forward voltage from a source of the order of 2 to 12 volts through a resistance on the order of 200 ohms, the base connection serving as a common connection for each voltage application.

10. The method of improving the amplification of a semiconductor amplifier having an emitter, a copper bearing collector on a hydrogen peroxide etched surface of a body of N-type germanium material and a base connection on another portion of said body, that comprises forming the collector by applying thereto an alternating voltage from a source on the order of 100 volts through a resistance on the order of 5,000 ohms while the emitter connection is subjected to a forward voltage from a source on the order of 2 to 12 volts through a resistance on the order of less than 200 ohms, the base connection serving as a common connection for each voltage application.

11. The method of improving the amplification of a semiconductor translating device that comprises grinding the surface of a body of N-type germanium material to produce a relatively smooth surface having minute irregularities, etching said surface, applying spaced point contacts to the etched surface, one of said contacts containing copper, and applying a relatively high alternating voltage to the copper containing contact while both contacts are connected to an ohmic connection on the body.

12. The method of improving the gain and extending the upper frequency range of a semiconductive translator having spaced restricted area contacts, that comprises applying an alternating voltage between the semiconductive body and a first restricted area contact through a resistor of sufficient resistance to hold the forward current through said one contact to a low value while another limited area contact is connected to the semiconductive body, the applied voltage being of sufficient amplitude to produce a negative, reverse resistance characteristic through said first contact.

WILLIAM G. PFANN.

REFERENCES CITED

The following references are of record in the file of this patent:

UNITED STATES PATENTS

| Number | Name | Date |
|---|---|---|
| 2,266,922 | Thompson et al. | Dec. 23, 1941 |
| 2,375,355 | Fahraeus | May 8, 1945 |
| 2,459,849 | Stateman | Jan. 25, 1949 |
| 2,497,649 | Amsden | Feb. 14, 1950 |